US012628640B2

(12) United States Patent
Guler et al.

(10) Patent No.: US 12,628,640 B2
(45) Date of Patent: May 12, 2026

(54) METAL LINE PROFILE SHAPING FOR ADVANCED INTEGRATED CIRCUIT STRUCTURE FABRICATION

(71) Applicant: Intel Corporation, Santa Clara, CA (US)

(72) Inventors: Leonard P. Guler, Hillsboro, OR (US); Tsuan-Chung Chang, Portland, OR (US); Michael James Makowski, Beaverton, OR (US); Benjamin Kriegel, Portland, OR (US); Robert Joachim, Beaverton, OR (US); Desalegne B. Teweldebrhan, Sherwood, OR (US); Charles H. Wallace, Portland, OR (US); Tahir Ghani, Portland, OR (US); Mohammad Hasan, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 153 days.

(21) Appl. No.: 17/357,773

(22) Filed: Jun. 24, 2021

(65) Prior Publication Data

US 2022/0415791 A1 Dec. 29, 2022

(51) Int. Cl.
*H01L 23/52* (2006.01)
*H10W 20/00* (2026.01)
(Continued)

(52) U.S. Cl.
CPC ....... *H10W 20/435* (2026.01); *H10W 20/056* (2026.01); *H10W 20/082* (2026.01); *H10W 20/42* (2026.01)

(58) Field of Classification Search
CPC ........... H01L 23/5283; H01L 21/76804; H01L 21/76816; H01L 21/76877; H01L 23/5226; H01L 23/53295
See application file for complete search history.

(56) References Cited

U.S. PATENT DOCUMENTS

| | | | | |
|---|---|---|---|---|
| 10,355,203 | B2 * | 7/2019 | Ito | .......................... H10N 50/01 |
| 2004/0198057 | A1 | 10/2004 | Huang | |
| 2021/0091190 | A1 | 3/2021 | Huang | |

FOREIGN PATENT DOCUMENTS

EP      1653509 A2     5/2006

OTHER PUBLICATIONS

Search Report from European Patent Application No. 22175145.6, mailed Nov. 21, 2022, 7 pgs.

(Continued)

*Primary Examiner* — Jay C Kim
*Assistant Examiner* — Joshua Scott Wyatt
(74) *Attorney, Agent, or Firm* — Schwabe, Williamson & Wyatt, P.C.

(57) ABSTRACT

Embodiments of the disclosure are in the field of integrated circuit structure fabrication. In an example, an integrated circuit structure includes a dielectric material structure having a trench therein. A conductive interconnect line in the trench, the conductive interconnect line having a length and a width, the width having a cross-sectional profile, wherein the cross-sectional profile of the width of the conductive interconnect line has a bottom lateral width, a mid-height lateral width, and a top lateral width, and wherein the mid-height lateral width is greater than the bottom lateral width, and the mid-height lateral width is greater than the top lateral width.

4 Claims, 12 Drawing Sheets

(51) Int. Cl.
  *H10W 20/41*      (2026.01)
  *H10W 20/42*      (2026.01)

(56)        References Cited

OTHER PUBLICATIONS

Notice of Allowance from European Patent Application No. 22175145.
6, mailed Sep. 19, 2025, 64 pgs.

* cited by examiner (a)

(b)

800

950

METAL LINE PROFILE SHAPING FOR ADVANCED INTEGRATED CIRCUIT STRUCTURE FABRICATION

TECHNICAL FIELD

Embodiments of the disclosure are in the field of advanced integrated circuit structure fabrication and, in particular, metal line profile shaping and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1:
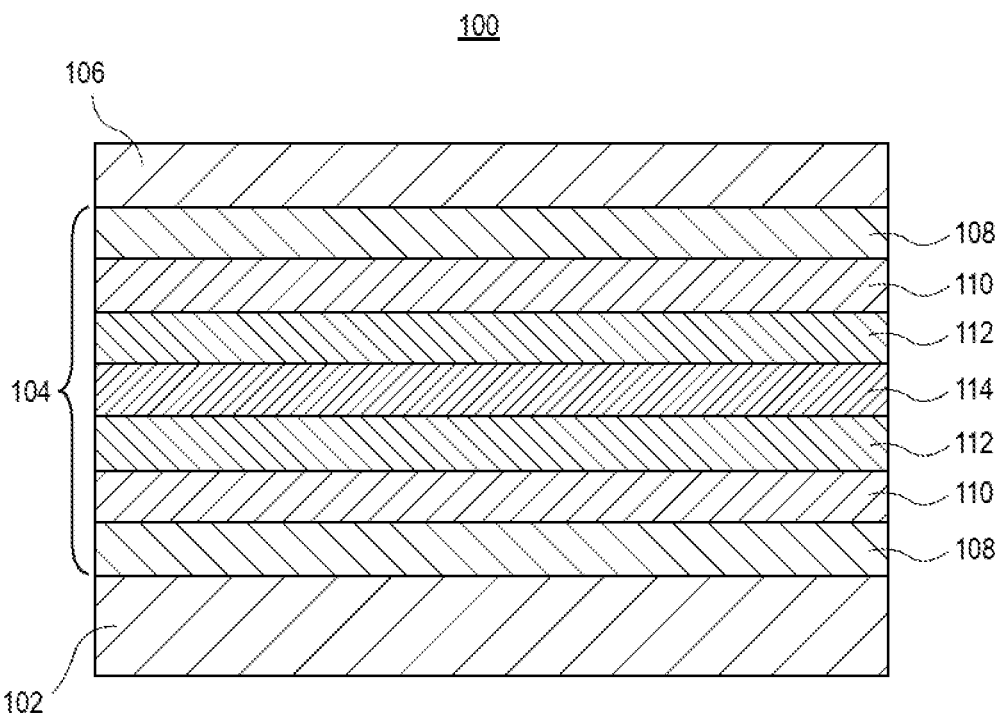
FIGS. 1-5 illustrate cross-sectional views representing various operations in a method of fabricating an integrated circuit structure, in accordance with an embodiment of the present disclosure.

Metal line profile shaping and the resulting structures are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology

The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

It is to be appreciated that FEOL is a technology driver for a given process. In other embodiment, FEOL considerations are driven by BEOL 10 nanometer or sub-10 nanometer processing requirements. For example, material selection and layouts for FEOL layers and devices may need to accommodate BEOL processing. In one such embodiment, material selection and gate stack architectures are selected to accommodate high density metallization of the BEOL layers, e.g., to reduce fringe capacitance in transistor structures formed in the FEOL layers but coupled together by high density metallization of the BEOL layers.

Back end of line (BEOL) layers of integrated circuits commonly include electrically conductive microelectronic structures, which are known in the art as vias, to electrically connect metal lines or other interconnects above the vias to metal lines or other interconnects below the vias. Vias may be formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

Sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). When patterning extremely small vias with extremely small pitches by such lithographic processes, several challenges present themselves. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) or critical dimension uniformity (CDU), or both. Yet another such challenge is that the LWR or CDU, or both, characteristics of photoresists generally need to improve as the critical dimensions of the via openings decrease in order to maintain the same overall fraction of the critical dimension budget.

Thus, improvements are needed in the area of back end metallization manufacturing technologies for fabricating metal lines and metal vias.

One or more embodiments described herein are directed to shaping a cross-sectional profile of a metal line. Embodiments may be implemented to reduce metal line resistance while preserving edge placement error (EPE) margin. Embodiments may be implemented to improving contact surface area for contact resistance reduction.

To provide context, interconnect scaling in the backend for higher density and better performance has brought RC and via resistance in focus as they impact the signal delay and lead to performance losses. Reducing via resistance while maintaining shorting margin without forcing design rule changes helps in performance improvement.

In accordance with one or more embodiments of the present disclosure, variable etch rate atomic layer deposition (ALD) based layers are used to generate a desirable cross-sectional profile as a template for metal fill. Embodiments may be implemented to create an inter-layer dielectric (ILD) stack from films that have different etch rate solubility in a particular wet clean chemistry. For example, a number of $SiO_2$ based film variants that have different solubility rates in a dilute hydrofluoric acid (DHF) chemistry can be used.

In an exemplary embodiment, a circular or substantially circular metal cross-section profile can be generated by using a slowest etching $SiO_2$ film at a bottom of a stack of dielectric layers and then layering with progressively faster etching $SiO_2$ films until a mid-height of the ILD stack is reached. The method proceeds by progressively stacking slower films above mid-height film.

As an exemplary processing scheme, FIGS. 1-5 illustrate cross-sectional views representing various operations in a method of fabricating an integrated circuit structure, in accordance with an embodiment of the present disclosure.

Referring to FIG. 1, a method of fabricating an integrated circuit structure includes forming a starting structure 100 including a stack of dielectric layers 104 on an etch stop layer 102, which may be on or above a metallization layer or a device layer. A hardmask 106 is formed on the stack of dielectric layers 104.

In an embodiment, ones of the dielectric layers in the stack 104 have a differing etch rate compared to others of the dielectric layers in the stack 104. In one embodiment, the topmost and bottommost dielectric layers 108 have a slowest etch rate. The next dielectric layers 110 have a faster etch rate than the dielectric layers 108. The next dielectric layers 112 have a faster etch rate than the dielectric layers 110. The middle dielectric layer 114 has the fastest etch rate of the dielectric layers in the stack 104. In a particular such embodiment, with respect to a dilute aqueous hydrofluoric acid (HF) solution, the topmost and bottommost dielectric layers 108 have an etch rate about 0.1 times the etch rate for a conventional silicon dioxide ($SiO_2$) film, the next dielectric layers 110 have an etch rate about 0.4 times the etch rate for a conventional silicon dioxide ($SiO_2$) film, the next dielectric layers 112 have an etch rate about 0.7 times the etch rate for a conventional silicon dioxide ($SiO_2$) film, and the middle dielectric layer has an etch rate about the same as the etch rate for a conventional silicon dioxide ($SiO_2$) film.

In an embodiment, ones of the dielectric layers in the stack 104 have a differing etch rate as a result of differing composition, such as differing compositions of doped silicon oxide films, where stoichiometry of silicon and oxygen and dopant (e.g., boron or phosphorous) is varied. In an embodiment, ones of the dielectric layers in the stack 104 have a differing etch rate as a result of differing density. In an embodiment, ones of the dielectric layers in the stack 104 have a differing etch rate as a result of differing composition and differing density.

Figure 2:
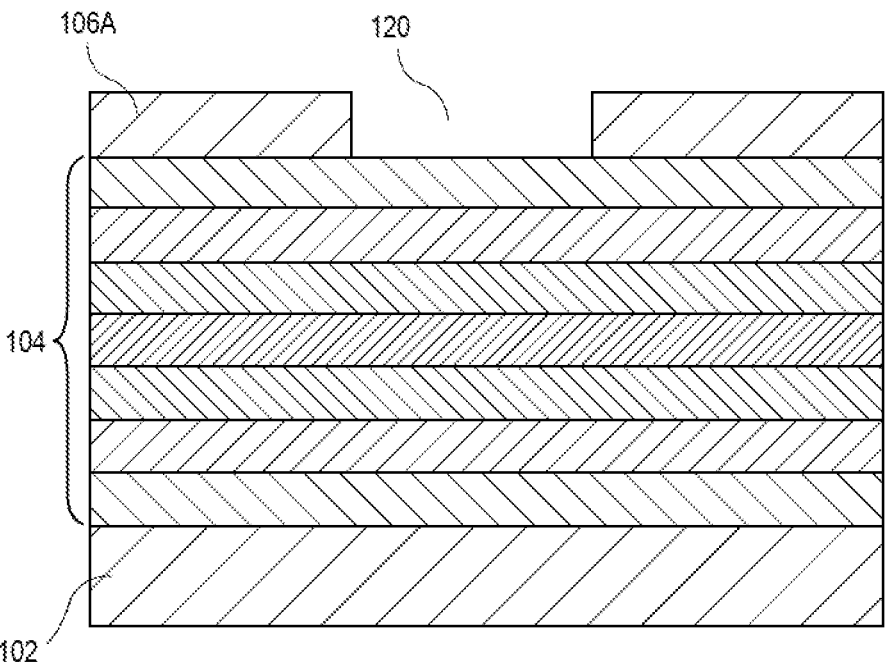

Referring to FIG. 2, an opening 120 is formed in the hardmask 106 to form patterned hardmask 106A. In an embodiment the opening is formed in a direct lithographic exposure (e.g., of a photoresist layer on the hardmask layer 106). In another embodiment, the opening is formed using a pitch halving or pitch quartering process, examples of which are described below.

Figure 3:
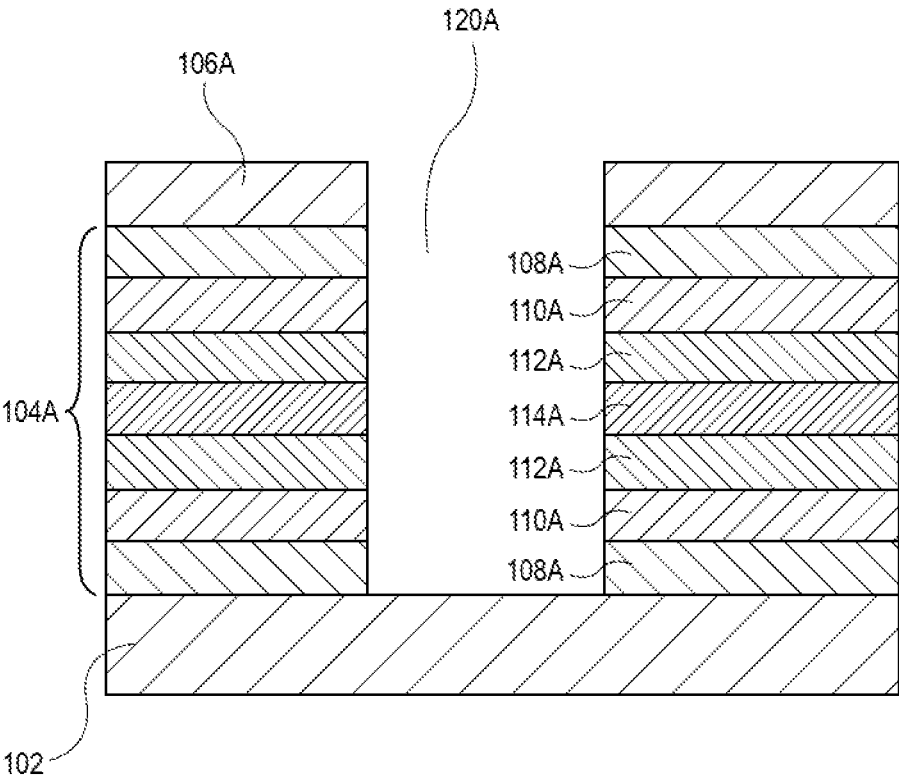

Referring to FIG. 3, the pattern of the trench 120 is extended into the stack of dielectric layers 104 to form trench 120A in a patterned stack of dielectric layers 104A (which includes patterned layers 108A, 110A, 112A and 114A). In an embodiment, a plasma etch or dry etch process is used to extend the trench 120 into the stack of dielectric layers 104. In one embodiment, the etch stops on the etch stop layer 102 (e.g., which may be a silicon nitride etch stop layer).

Figures 4, 5:
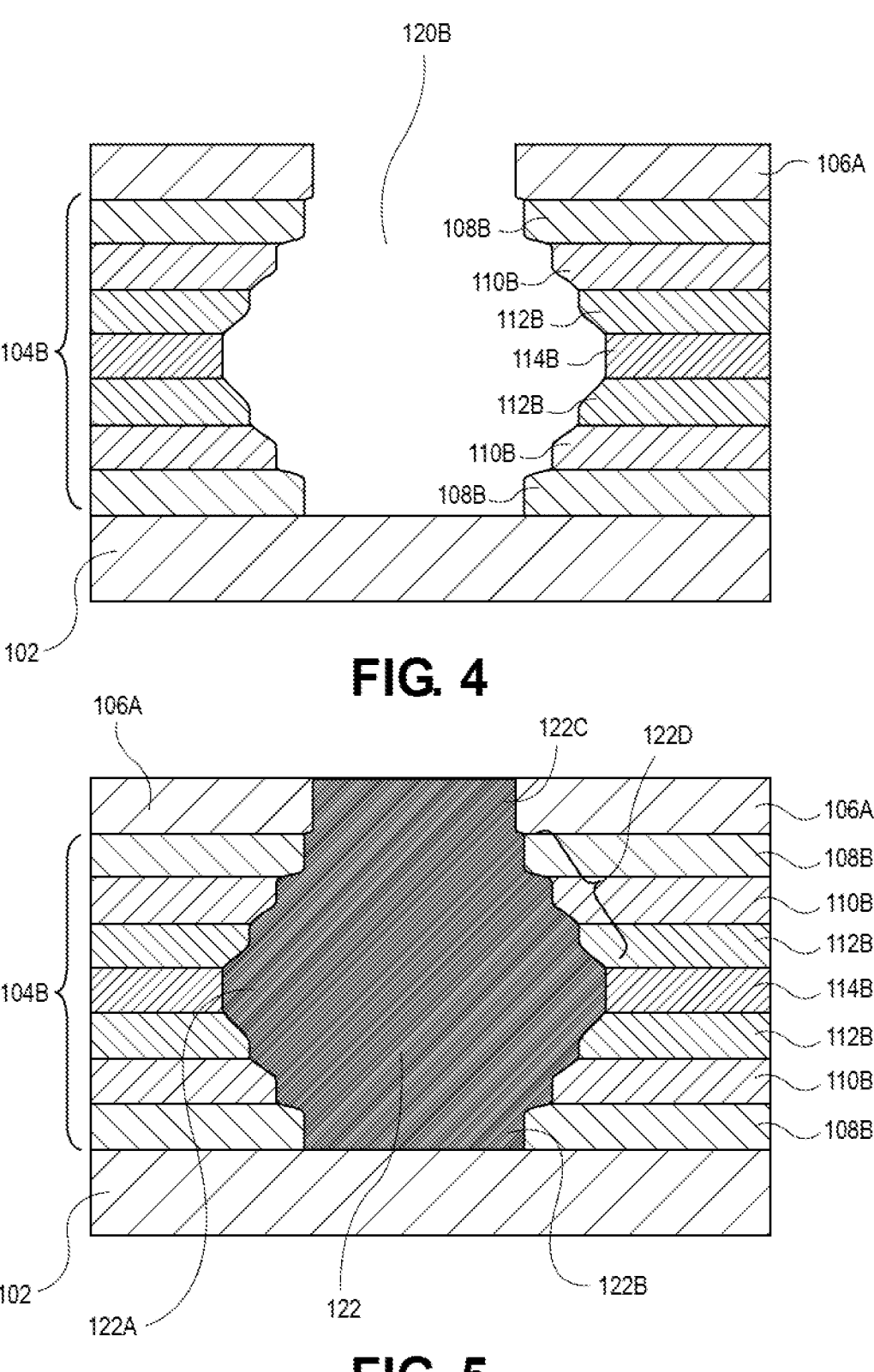

Referring to FIG. 4, the trench 120A is exposed to a wet etch process to laterally recess the patterned stack of dielectric layers 104A to form a modified trench 120B in a recessed stack of dielectric layers 104B. In an embodiment, ones of the dielectric layers 114 are recessed to a greater extent than others of the stack of dielectric layers 104A to form the recessed stack of dielectric layers 104B including differentially recessed layers 108B, 110B, 112B and 114B.

Referring to FIG. 5, the modified trench 120B is filled with a conductive material 122. In an embodiment, a conductive material is deposited and then planarized to form conductive material 122. In an embodiment, conductive material 122 includes a liner barrier layer and bulk fill, examples of which are described in greater detail below.

It is to be appreciated that the above approach may be modified to vary the cross-sectional profile of the conductive material 122. For example, in another embodiment, the etch selectivities of the stack of dielectric layers are reversed, and an hour-glass cross-sectional shape is achieved. In another embodiment, etch rate selectivity is increased from top to bottom, and a pyramid cross-sectional shape is achieved. In yet another embodiment, etch rate selectivity is increased from bottom to top, and a reverse pyramid cross-sectional shape is achieved.

Referring again to FIG. 5, in an embodiment, filling the modified trench 120B with the conductive material 122 includes forming a conductive interconnect line in the modified trench 120B. The conductive interconnect line has a length (into and out of the page) and a width (as shown). The width has a cross-sectional profile, where the cross-sectional profile of the width of the conductive interconnect line has a bottom lateral width 122B, a mid-height lateral width 122A, and a top lateral width 122C. In one such embodiment, the mid-height lateral width 122A is greater than the bottom lateral 122B width, and the mid-height lateral width 122A is greater than the top lateral width 122C, as is depicted. In one embodiment, the cross-sectional profile of the width of the conductive interconnect line is substantially spherical, as is depicted. In one embodiment, the mid-height lateral width 122A is at least 50% greater than the bottom lateral width 122B and at least 50% greater than the top lateral width 122C, as is depicted. In one embodiment, the cross-sectional profile of the width of the conductive interconnect line has one or more scalloped surfaces 122D, as is depicted.

In an embodiment, the recessed stack of dielectric layers 104B is subsequently removed and then replaced with a different dielectric material, such as a uniform low-k dielectric material. In other embodiments, the recessed stack of dielectric layers 104B is retained in the final product.

In an embodiment, a conductive via is formed on and in electrical contact with a portion of the conductive interconnect line. In one such embodiment, a center of the conductive via is vertically offset from a center of the conductive interconnect line. Exemplary such arrangements are described in greater detail below in association with FIG. 6B.

In one aspect, a metal line resistance benefit can be achieved with impacting EPE. As an example, FIG. 6A illustrates cross-sectional views representing a landed via and an unlanded via for conventional conductive interconnects, and FIG. 6B illustrates cross-sectional views representing a landed via and an unlanded via for shaped conductive interconnects, in accordance with an embodiment of the present disclosure.

Figure 6A:
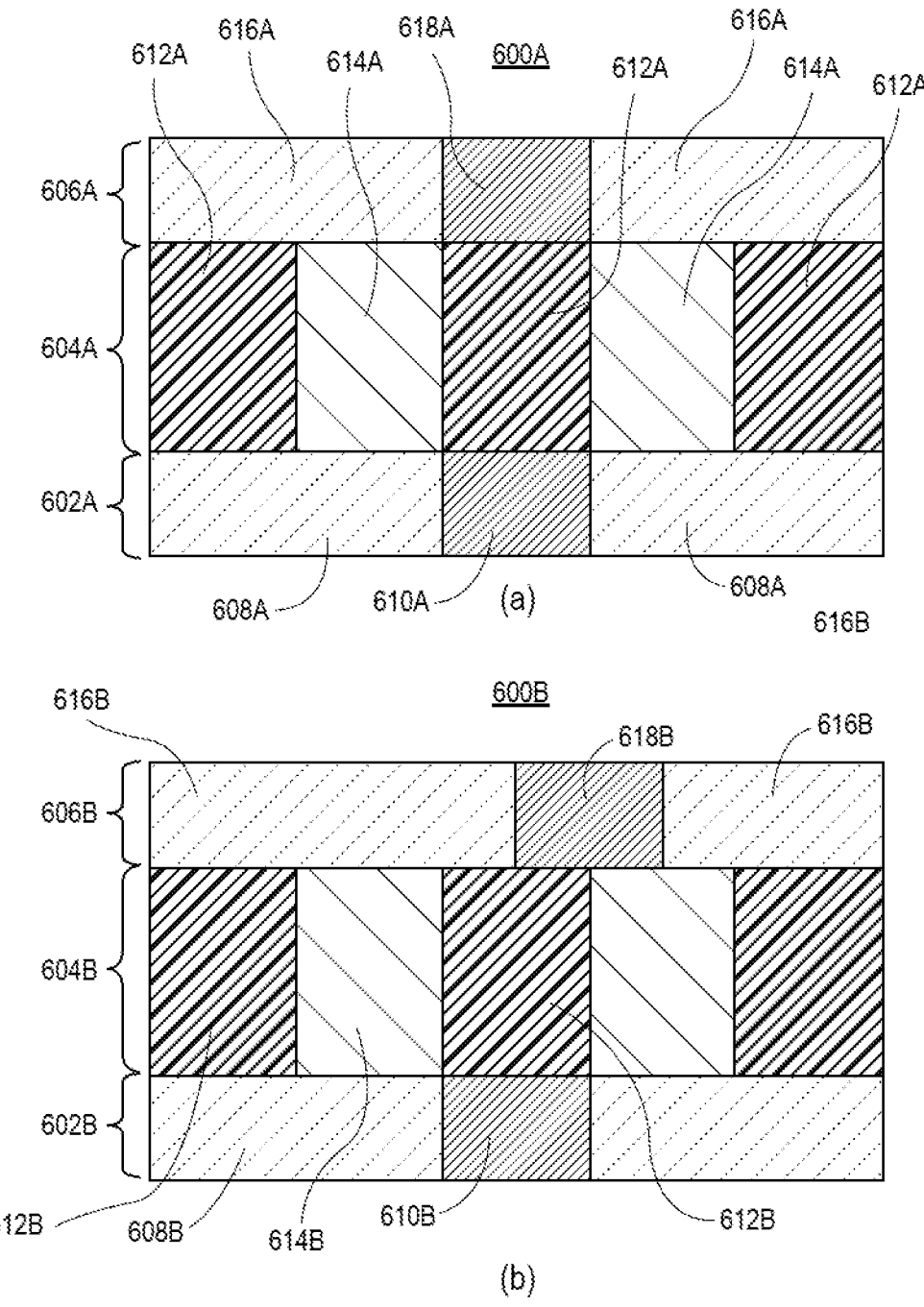
FIG. 6A illustrates cross-sectional views representing a landed via and an unlanded via for conventional conductive interconnects.

Referring to part (a) of FIG. 6A, an integrated circuit structure 600A includes a lower via layer 602A, a conductive line layer 604A, and an upper via layer 606A. The lower via layer 602A includes a conductive via 610A in a dielectric layer 608A. The conductive line layer 604A includes conventional conductive lines 612A in a dielectric layer 614A. The top via layer 606A includes a conductive via 618A in a dielectric layer 616A. As depicted, conductive via 618A is perfectly aligned to the corresponding central conductive line 612A (zero EPE), leading to minimized resistance between the conductive via 618A and the corresponding central conductive line 612A.

Referring to part (b) of FIG. 6A, an integrated circuit structure 600B includes a lower via layer 602B, a conductive line layer 604B, and an upper via layer 606B. The lower via layer 602B includes a conductive via 610B in a dielectric layer 608B. The conductive line layer 604B includes conventional conductive lines 612B in a dielectric layer 614B. The top via layer 606B includes a conductive via 618B in a dielectric layer 616B. As depicted, conductive via 618B is misaligned with the corresponding central conductive line 612B (non-zero EPE), leading to increased resistance between the conductive via 618B and the corresponding central conductive line 612B.

Figure 6B:
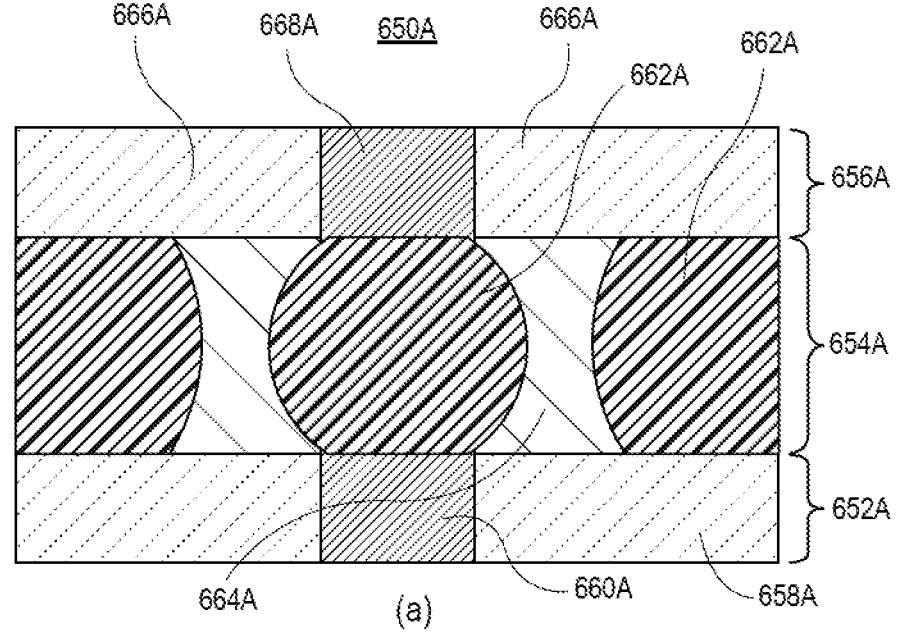
FIG. 6B illustrates cross-sectional views representing a landed via and an unlanded via for shaped conductive interconnects, in accordance with an embodiment of the present disclosure.
Figure 6B:
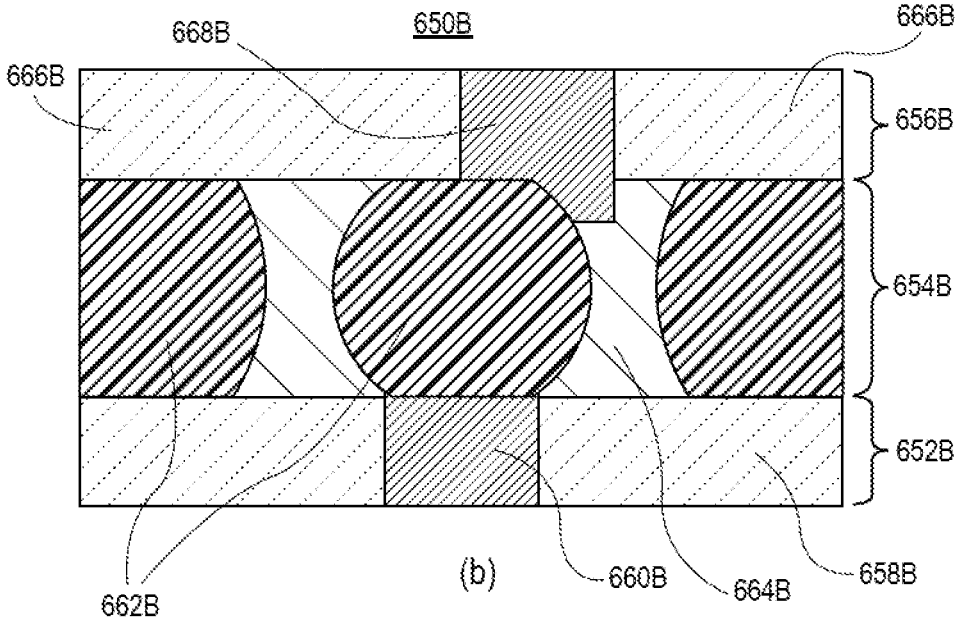

Referring to part (a) of FIG. 6B, an integrated circuit structure 650A includes a lower via layer 652A, a conductive line layer 654A, and an upper via layer 656A. The lower via layer 652A includes a conductive via 660A in a dielectric layer 658A. The conductive line layer 654A includes shaped conductive lines 662A in a dielectric layer 664A. The top via layer 656A includes a conductive via 668A in a dielectric layer 666A. As depicted, conductive via 668A is perfectly aligned to the corresponding central conductive line 662A (zero EPE), leading to minimized resistance between the conductive via 668A and the corresponding central conductive line 662A.

Referring to part (b) of FIG. 6B, an integrated circuit structure 650B includes a lower via layer 652B, a conductive line layer 654B, and an upper via layer 656B. The lower via layer 652B includes a conductive via 660B in a dielectric layer 658B. The conductive line layer 654B includes shaped conductive lines 662B in a dielectric layer 664B. The top via layer 656B includes a conductive via 668B in a dielectric layer 666B. As depicted, conductive via 668A is misaligned with the corresponding central conductive line 662B (non-zero EPE). However, because of the substantially circular geometry of the corresponding central conductive line 662B, large surface contact is maintained between the conductive via 668A and the corresponding central conductive line 662B. The result can be no increase or minimal increase in resistance between the conductive via 668B and the corresponding central conductive line 662B, in contrast to the unlanded example of part (b) of FIG. 6A.

In another aspect, a pitch division approach (such as a pitch halving or pitch quartering approach) is implemented for patterning a hardmask ultimately used to fabricate modified trenches in a dielectric layer for forming BEOL interconnect structures. In accordance with an embodiment of the present disclosure, pitch division is applied for fabricating metal lines in a BEOL fabrication scheme. Embodiments may enable continued scaling of the pitch of metal layers beyond the resolution capability of state-of-the art lithography equipment.

Figure 7:
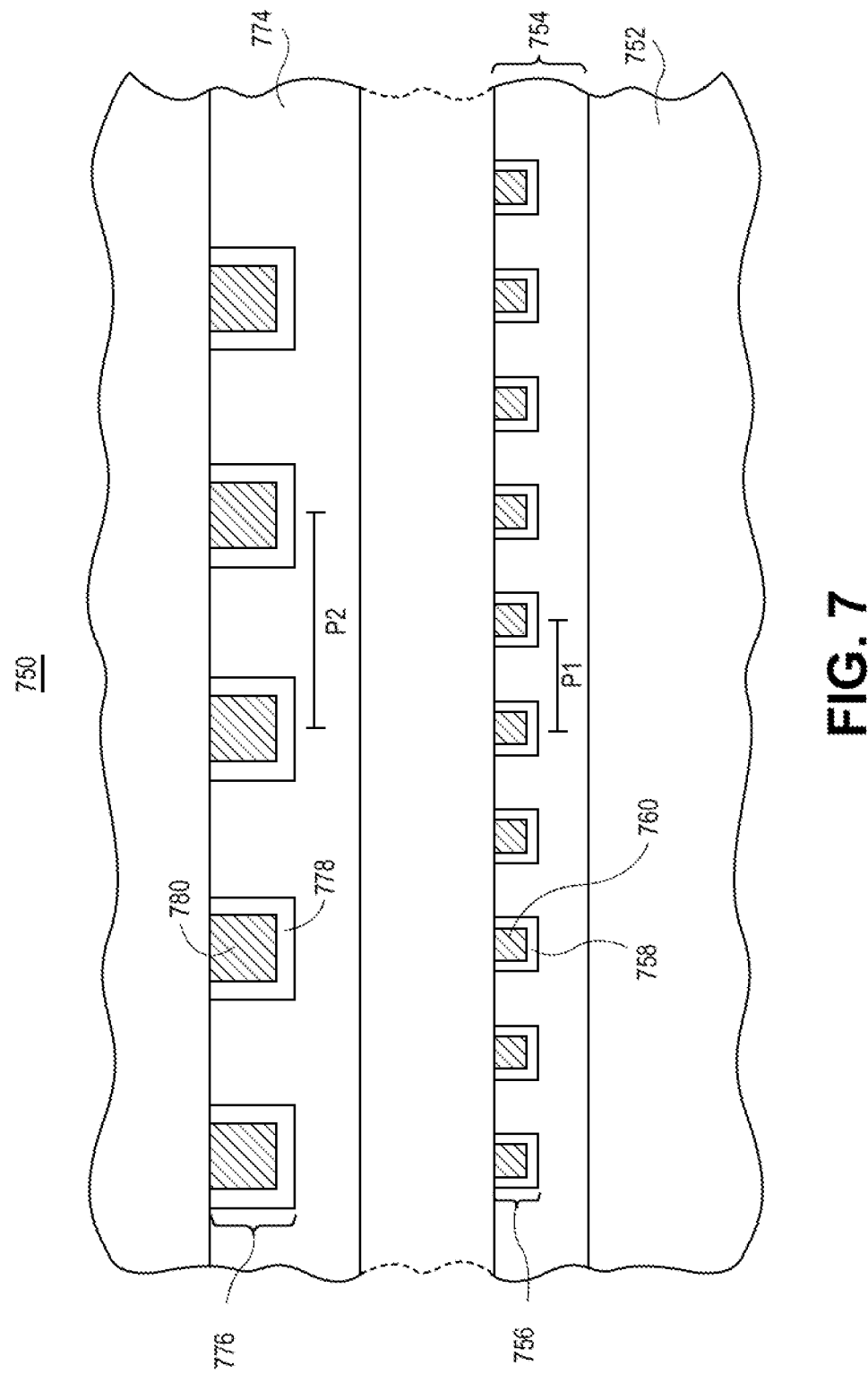
FIG. 7 illustrates a cross-sectional view of a metallization layer fabricated using pitch halving scheme above a metallization layer fabricated using pitch quartering scheme, in accordance with an embodiment of the present disclosure.

FIG. 7 illustrates a cross-sectional view of a metallization layer fabricated using pitch halving scheme above a metallization layer fabricated using pitch quartering scheme, in accordance with an embodiment of the present disclosure. In an embodiment, one or more of the conductive interconnect lines described below in association with FIG. 7 is formed using a metal line profile shaping approach, such as described above in association with FIGS. 1-5 and 6B.

Referring to FIG. 7, an integrated circuit structure 750 includes a first inter-layer dielectric (ILD) layer 754 above a substrate 752. A first plurality of conductive interconnect lines 756 is in the first ILD layer 754, and individual ones of the first plurality of conductive interconnect lines 756 are spaced apart from one another by portions of the first ILD layer 754. Individual ones of the plurality of conductive interconnect lines 756 includes a conductive barrier layer 758 and a conductive fill material 760. The integrated circuit structure 750 further includes a second inter-layer dielectric (ILD) layer 774 above substrate 752. A second plurality of conductive interconnect lines 776 is in the second ILD layer 774, and individual ones of the second plurality of conductive interconnect lines 776 are spaced apart from one another by portions of the second ILD layer 774. Individual ones of the plurality of conductive interconnect lines 776 includes a conductive barrier layer 778 and a conductive fill material 780.

In accordance with an embodiment of the present disclosure, with reference again to FIG. 7, a method of fabricating an integrated circuit structure includes forming a first plurality of conductive interconnect lines 756 in and spaced apart by a first inter-layer dielectric (ILD) layer 754 above a substrate 752. The first plurality of conductive interconnect lines 756 is formed using a spacer-based pitch quartering process. A second plurality of conductive interconnect lines 776 is formed in and is spaced apart by a second ILD layer 774 above the first ILD layer 754. The second plurality of conductive interconnect lines 776 is formed using a spacer-based pitch halving process.

In an embodiment, first plurality of conductive interconnect lines 756 has a pitch (P1) between immediately adjacent lines of less than 40 nanometers. The second plurality of conductive interconnect lines 776 has a pitch (P2) between immediately adjacent lines of 44 nanometers or greater. In an embodiment, the spacer-based pitch quartering process and the spacer-based pitch halving process are based on an immersion 193 nm lithography process.

In an embodiment, individual ones of the first plurality of conductive interconnect lines 754 include a first conductive barrier liner 758 and a first conductive fill material 760. Individual ones of the second plurality of conductive interconnect lines 756 include a second conductive barrier liner 778 and a second conductive fill material 780. In one such embodiment, the first conductive fill material 760 is different in composition from the second conductive fill material 780. In another embodiment, the first conductive fill material 760 is the same in composition as the second conductive fill material 780. In an embodiment, the first conductive barrier liner 758 and/or the second conductive barrier liner 778 is a single, nitrogen-free tantalum (Ta) barrier layer.

Although not depicted, in an embodiment, the method further includes forming a third plurality of conductive interconnect lines in and spaced apart by a third ILD layer above the second ILD layer 774. The third plurality of conductive interconnect lines is formed without using pitch division.

Although not depicted, in an embodiment, the method further includes, prior to forming the second plurality of conductive interconnect lines 776, forming a third plurality of conductive interconnect lines in and spaced apart by a third ILD layer above the first ILD layer 754. The third plurality of conductive interconnect lines is formed using a spacer-based pitch quartering process. In one such embodiment, subsequent to forming the second plurality of conductive interconnect lines 776, a fourth plurality of conductive interconnect lines is formed in and is spaced apart by a fourth ILD layer above the second ILD layer 774. The fourth plurality of conductive interconnect lines is formed using a spacer-based pitch halving process. In an embodiment, such a method further includes forming a fifth plurality of conductive interconnect lines in and spaced apart by a fifth ILD layer above the fourth ILD layer, the fifth plurality of conductive interconnect lines formed using a spacer-based pitch halving process. A sixth plurality of conductive interconnect lines is then formed in and spaced apart by a sixth ILD layer above the fifth ILD layer, the sixth plurality of conductive interconnect lines formed using a spacer-based pitch halving process. A seventh plurality of conductive interconnect lines is then formed in and spaced apart by a seventh ILD layer above the sixth ILD layer. The seventh plurality of conductive interconnect lines is formed without using pitch division.

In another aspect, metal line compositions vary between metallization layers. Such an arrangement may be referred to as heterogeneous metallization layers. In an embodiment, copper is used as a conductive fill material for relatively larger interconnect lines, while cobalt is used as a conductive fill material for relatively smaller interconnect lines. The smaller lines having cobalt as a fill material may provide reduced electromigration while maintaining low resistivity. The use of cobalt in place of copper for smaller interconnect lines may address issues with scaling copper lines, where a conductive barrier layer consumes a greater amount of an interconnect volume and copper is reduced, essentially hindering advantages normally associated with a copper interconnect line.

Figure 8:
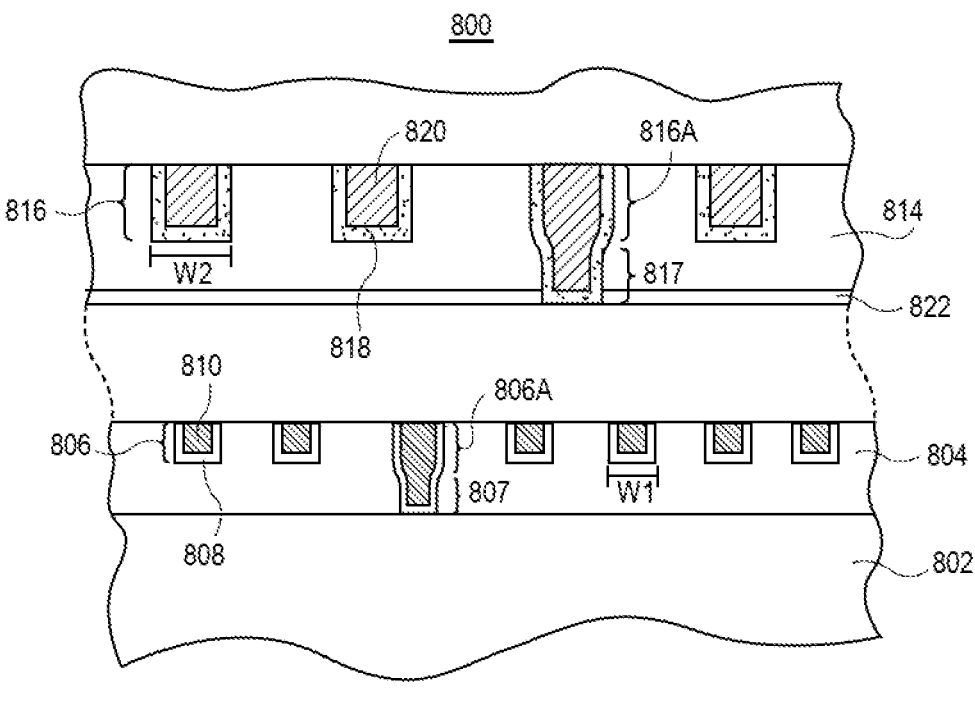
FIG. 8 illustrates a cross-sectional view of an integrated circuit structure having a metallization layer with a metal line composition above a metallization layer with a differing metal line composition, in accordance with an embodiment of the present disclosure.

In a first example, FIG. 8 illustrates a cross-sectional view of an integrated circuit structure having a metallization layer with a metal line composition above a metallization layer with a differing metal line composition, in accordance with an embodiment of the present disclosure. In an embodiment, one or more of the conductive interconnect lines described below in association with FIG. 8 is formed using a metal line profile shaping approach, such as described above in association with FIGS. 1-5 and 6B.

Referring to FIG. 8, an integrated circuit structure 800 includes a first plurality of conductive interconnect lines 806 in and spaced apart by a first inter-layer dielectric (ILD) layer 804 above a substrate 802. One of the conductive interconnect lines 806A is shown as having an underlying via 807. Individual ones of the first plurality of conductive interconnect lines 806 include a first conductive barrier material 808 along sidewalls and a bottom of a first conductive fill material 810.

A second plurality of conductive interconnect lines 816 is in and spaced apart by a second ILD layer 814 above the first ILD layer 804. One of the conductive interconnect lines 816A is shown as having an underlying via 817. Individual ones of the second plurality of conductive interconnect lines 816 include a second conductive barrier material 818 along sidewalls and a bottom of a second conductive fill material 820. The second conductive fill material 820 is different in composition from the first conductive fill material 810. In an embodiment, the second conductive barrier material 818 is a single, nitrogen-free tantalum (Ta) barrier layer. In an embodiment, interconnect line 816A/underlying via 817 is formed using a partial trench, hanging via, final trench process flow.

In an embodiment, the second conductive fill material 820 consists essentially of copper, and the first conductive fill material 810 consists essentially of cobalt. In one such embodiment, the first conductive barrier material 808 is different in composition from the second conductive barrier material 818. In another such embodiment, the first conductive barrier material 808 is the same in composition as the second conductive barrier material 818.

In an embodiment, the first conductive fill material 810 includes copper having a first concentration of a dopant impurity atom, and the second conductive fill material 820 includes copper having a second concentration of the dopant impurity atom. The second concentration of the dopant impurity atom is less than the first concentration of the dopant impurity atom. In one such embodiment, the dopant impurity atom is selected from the group consisting of aluminum (Al) and manganese (Mn). In an embodiment, the first conductive barrier material 810 and the second conductive barrier material 820 have the same composition. In an embodiment, the first conductive barrier material 810 and the second conductive barrier material 820 have a different composition.

Referring again to FIG. 8, the second ILD layer 814 is on an etch-stop layer 822. The conductive via 817 is in the second ILD layer 814 and in an opening of the etch-stop layer 822. In an embodiment, the first and second ILD layers 804 and 814 include silicon, carbon and oxygen, and the etch-stop layer 822 includes silicon and nitrogen. In an embodiment, individual ones of the first plurality of conductive interconnect lines 806 have a first width (W1), and individual ones of the second plurality of conductive interconnect lines 816 have a second width (W2) greater than the first width (W1).

Figure 9:
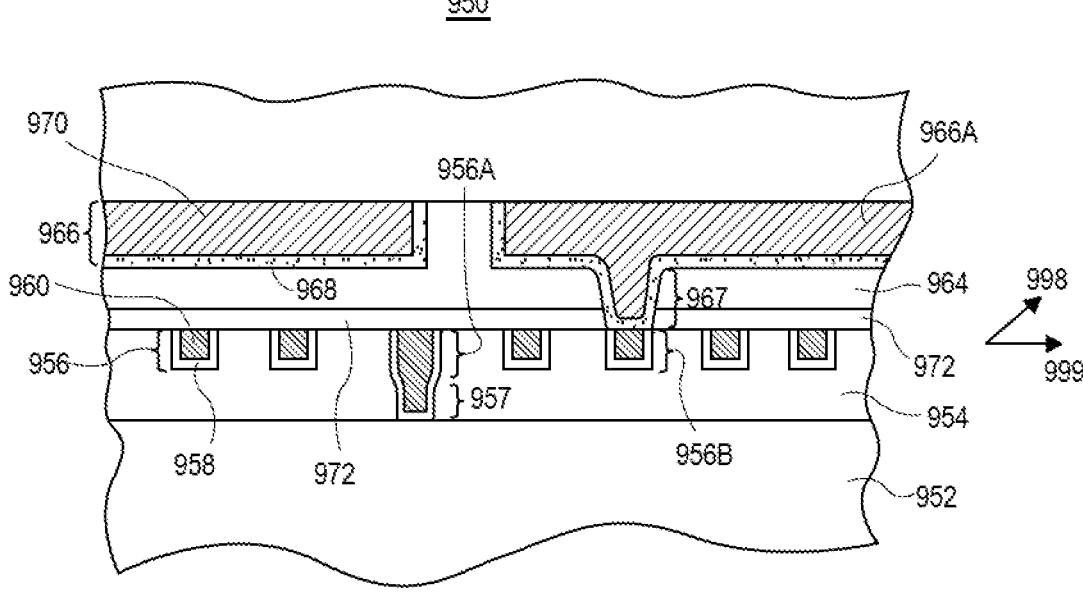
FIG. 9 illustrates a cross-sectional view of an integrated circuit structure having a metallization layer with a metal line composition coupled to a metallization layer with a differing metal line composition, in accordance with an embodiment of the present disclosure.

In a second example, FIG. 9 illustrates a cross-sectional view of an integrated circuit structure having a metallization layer with a metal line composition coupled to a metallization layer with a differing metal line composition, in accordance with an embodiment of the present disclosure. In an embodiment, one or more of the conductive interconnect lines described below in association with FIG. 9 is formed using a metal line profile shaping approach, such as described above in association with FIGS. 1-5 and 6B.

Referring to FIG. 9, an integrated circuit structure 950 includes a first plurality of conductive interconnect lines 956 in and spaced apart by a first inter-layer dielectric (ILD) layer 954 above a substrate 952. One of the conductive interconnect lines 956A is shown as having an underlying via 957. Individual ones of the first plurality of conductive interconnect lines 956 include a first conductive barrier material 958 along sidewalls and a bottom of a first conductive fill material 960.

A second plurality of conductive interconnect lines 966 is in and spaced apart by a second ILD layer 964 above the first ILD layer 954. One of the conductive interconnect lines 966A is shown as having an underlying via 967. Individual ones of the second plurality of conductive interconnect lines 966 include a second conductive barrier material 968 along sidewalls and a bottom of a second conductive fill material 970. The second conductive fill material 970 is different in composition from the first conductive fill material 960. In an embodiment, the second conductive barrier material 968 is a single, nitrogen-free tantalum (Ta) barrier layer. In an embodiment, interconnect line 966A/underlying via 967 is formed using a partial trench, hanging via, final trench process flow.

In an embodiment, the conductive via 967 is on and electrically coupled to an individual one 956B of the first plurality of conductive interconnect lines 956, electrically coupling the individual one 966A of the second plurality of conductive interconnect lines 966 to the individual one 956B of the first plurality of conductive interconnect lines 956. In an embodiment, individual ones of the first plurality of conductive interconnect lines 956 are along a first direction 998 (e.g., into and out of the page), and individual ones of the second plurality of conductive interconnect lines 966 are along a second direction 999 orthogonal to the first direction 998, as is depicted. In an embodiment, the conductive via 967 includes the second conductive barrier material 968 along sidewalls and a bottom of the second conductive fill material 970, as is depicted.

In an embodiment, the second ILD layer 964 is on an etch-stop layer 972 on the first ILD layer 954. The conductive via 967 is in the second ILD layer 964 and in an opening of the etch-stop layer 972. In an embodiment, the first and second ILD layers 954 and 964 include silicon, carbon and oxygen, and the etch-stop layer 972 includes silicon and nitrogen. In an embodiment, individual ones of the first plurality of conductive interconnect lines 956 have a first width, and individual ones of the second plurality of conductive interconnect lines 966 have a second width greater than the first width.

In an embodiment, the second conductive fill material 970 consists essentially of copper, and the first conductive fill material 960 consists essentially of cobalt. In one such embodiment, the first conductive barrier material 958 is different in composition from the second conductive barrier material 968. In another such embodiment, the first conductive barrier material 958 is the same in composition as the second conductive barrier material 968.

In an embodiment, the first conductive fill material 960 includes copper having a first concentration of a dopant impurity atom, and the second conductive fill material 970 includes copper having a second concentration of the dopant impurity atom. The second concentration of the dopant impurity atom is less than the first concentration of the dopant impurity atom. In one such embodiment, the dopant impurity atom is selected from the group consisting of aluminum (Al) and manganese (Mn). In an embodiment, the first conductive barrier material 960 and the second conductive barrier material 970 have the same composition. In an embodiment, the first conductive barrier material 960 and the second conductive barrier material 970 have a different composition.

Figure 10:
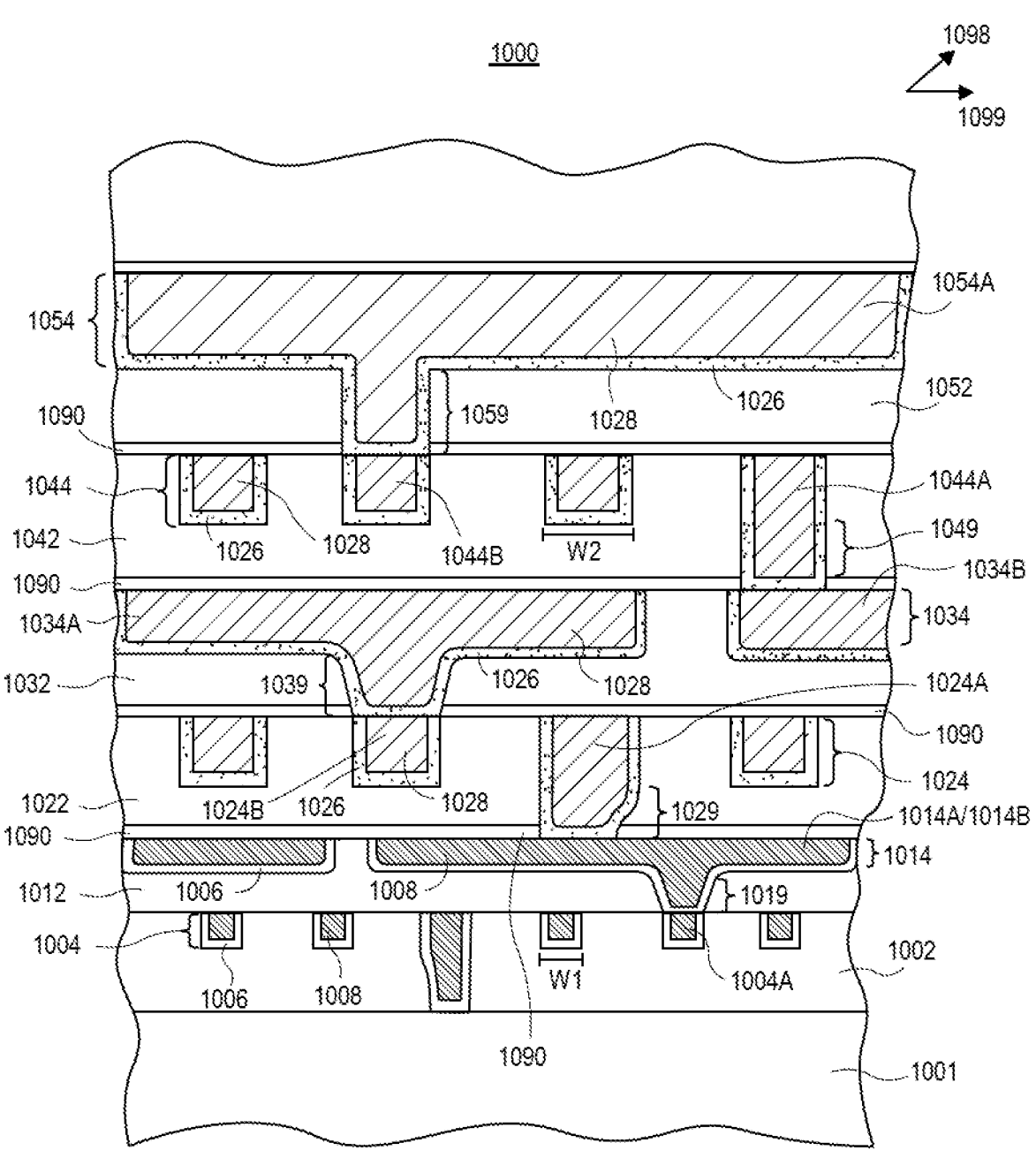
FIG. 10 illustrates a cross-sectional view of an integrated circuit structure having four metallization layers with a metal line composition and pitch above two metallization layers with a differing metal line composition and smaller pitch, in accordance with an embodiment of the present disclosure.

FIG. 10 illustrates a cross-sectional view of an integrated circuit structure having four metallization layers with a metal line composition and pitch above two metallization layers with a differing metal line composition and smaller pitch, in accordance with an embodiment of the present disclosure. In an embodiment, one or more of the conductive interconnect lines described below in association with FIG. 10 is formed using a metal line profile shaping approach, such as described above in association with FIGS. 1-5 and 6B.

Referring to FIG. 10, an integrated circuit structure 1000 includes a first plurality of conductive interconnect lines 1004 in and spaced apart by a first inter-layer dielectric (ILD) layer 1002 above a substrate 1001. Individual ones of the first plurality of conductive interconnect lines 1004 include a first conductive barrier material 1006 along sidewalls and a bottom of a first conductive fill material 1008. Individual ones of the first plurality of conductive interconnect lines 1004 are along a first direction 1098 (e.g., into and out of the page).

A second plurality of conductive interconnect lines 1014 is in and spaced apart by a second ILD layer 1012 above the first ILD layer 1002. Individual ones of the second plurality of conductive interconnect lines 1014 include the first conductive barrier material 1006 along sidewalls and a bottom of the first conductive fill material 1008. Individual ones of the second plurality of conductive interconnect lines 1014 are along a second direction 1099 orthogonal to the first direction 1098.

A third plurality of conductive interconnect lines 1024 is in and spaced apart by a third ILD layer 1022 above the second ILD layer 1012. Individual ones of the third plurality of conductive interconnect lines 1024 include a second conductive barrier material 1026 along sidewalls and a bottom of a second conductive fill material 1028. The second conductive fill material 1028 is different in composition from the first conductive fill material 1008. Individual ones of the third plurality of conductive interconnect lines 1024 are along the first direction 1098. In an embodiment, the second conductive barrier material 1026 is a single, nitrogen-free tantalum (Ta) barrier layer.

A fourth plurality of conductive interconnect lines 1034 is in and spaced apart by a fourth ILD layer 1032 above the third ILD layer 1022. Individual ones of the fourth plurality of conductive interconnect lines 1034 include the second conductive barrier material 1026 along sidewalls and a bottom of the second conductive fill material 1028. Individual ones of the fourth plurality of conductive interconnect lines 1034 are along the second direction 1099.

A fifth plurality of conductive interconnect lines 1044 is in and spaced apart by a fifth ILD layer 1042 above the fourth ILD layer 1032. Individual ones of the fifth plurality of conductive interconnect lines 1044 include the second conductive barrier material 1026 along sidewalls and a bottom of the second conductive fill material 1028. Individual ones of the fifth plurality of conductive interconnect lines 1044 are along the first direction 1098.

A sixth plurality of conductive interconnect lines 1054 is in and spaced apart by a sixth ILD layer 1052 above the fifth ILD layer 1042. Individual ones of the sixth plurality of conductive interconnect lines 1054 include the second conductive barrier material 1026 along sidewalls and a bottom of the second conductive fill material 1028. Individual ones of the sixth plurality of conductive interconnect lines 1054 are along the second direction 1099.

In an embodiment, the second conductive fill material 1028 consists essentially of copper, and the first conductive fill material 1008 consists essentially of cobalt. In an embodiment, the first conductive fill material 1008 includes copper having a first concentration of a dopant impurity atom, and the second conductive fill material 1028 includes copper having a second concentration of the dopant impurity atom, the second concentration of the dopant impurity atom less than the first concentration of the dopant impurity atom.

In an embodiment, the first conductive barrier material 1006 is different in composition from the second conductive barrier material 1026. In another embodiment, the first conductive barrier material 1006 and the second conductive barrier material 1026 have the same composition.

In an embodiment, a first conductive via 1019 is on and electrically coupled to an individual one 1004A of the first plurality of conductive interconnect lines 1004. An individual one 1014A of the second plurality of conductive interconnect lines 1014 is on and electrically coupled to the first conductive via 1019.

A second conductive via 1029 is on and electrically coupled to an individual one 1014B of the second plurality of conductive interconnect lines 1014. An individual one 1024A of the third plurality of conductive interconnect lines 1024 is on and electrically coupled to the second conductive via 1029.

A third conductive via 1039 is on and electrically coupled to an individual one 1024B of the third plurality of conductive interconnect lines 1024. An individual one 1034A of the fourth plurality of conductive interconnect lines 1034 is on and electrically coupled to the third conductive via 1039.

A fourth conductive via 1049 is on and electrically coupled to an individual one 1034B of the fourth plurality of conductive interconnect lines 1034. An individual one 1044A of the fifth plurality of conductive interconnect lines 1044 is on and electrically coupled to the fourth conductive via 1049.

A fifth conductive via 1059 is on and electrically coupled to an individual one 1044B of the fifth plurality of conductive interconnect lines 1044. An individual one 1054A of the sixth plurality of conductive interconnect lines 1054 is on and electrically coupled to the fifth conductive via 1059.

In one embodiment, the first conductive via 1019 includes the first conductive barrier material 1006 along sidewalls and a bottom of the first conductive fill material 1008. The second 1029, third 1039, fourth 1049 and fifth 1059 conductive vias include the second conductive barrier material 1026 along sidewalls and a bottom of the second conductive fill material 1028.

In an embodiment, the first 1002, second 1012, third 1022, fourth 1032, fifth 1042 and sixth 1052 ILD layers are separated from one another by a corresponding etch-stop layer 1090 between adjacent ILD layers. In an embodiment, the first 1002, second 1012, third 1022, fourth 1032, fifth 1042 and sixth 1052 ILD layers include silicon, carbon and oxygen.

In an embodiment, individual ones of the first 1004 and second 1014 pluralities of conductive interconnect lines have a first width (W1). Individual ones of the third 1024, fourth 1034, fifth 1044 and sixth 1054 pluralities of conductive interconnect lines have a second width (W2) greater than the first width (W1).

It is to be appreciated that the layers and materials described above in association with back end of line (BEOL) structures and processing may be formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 11:
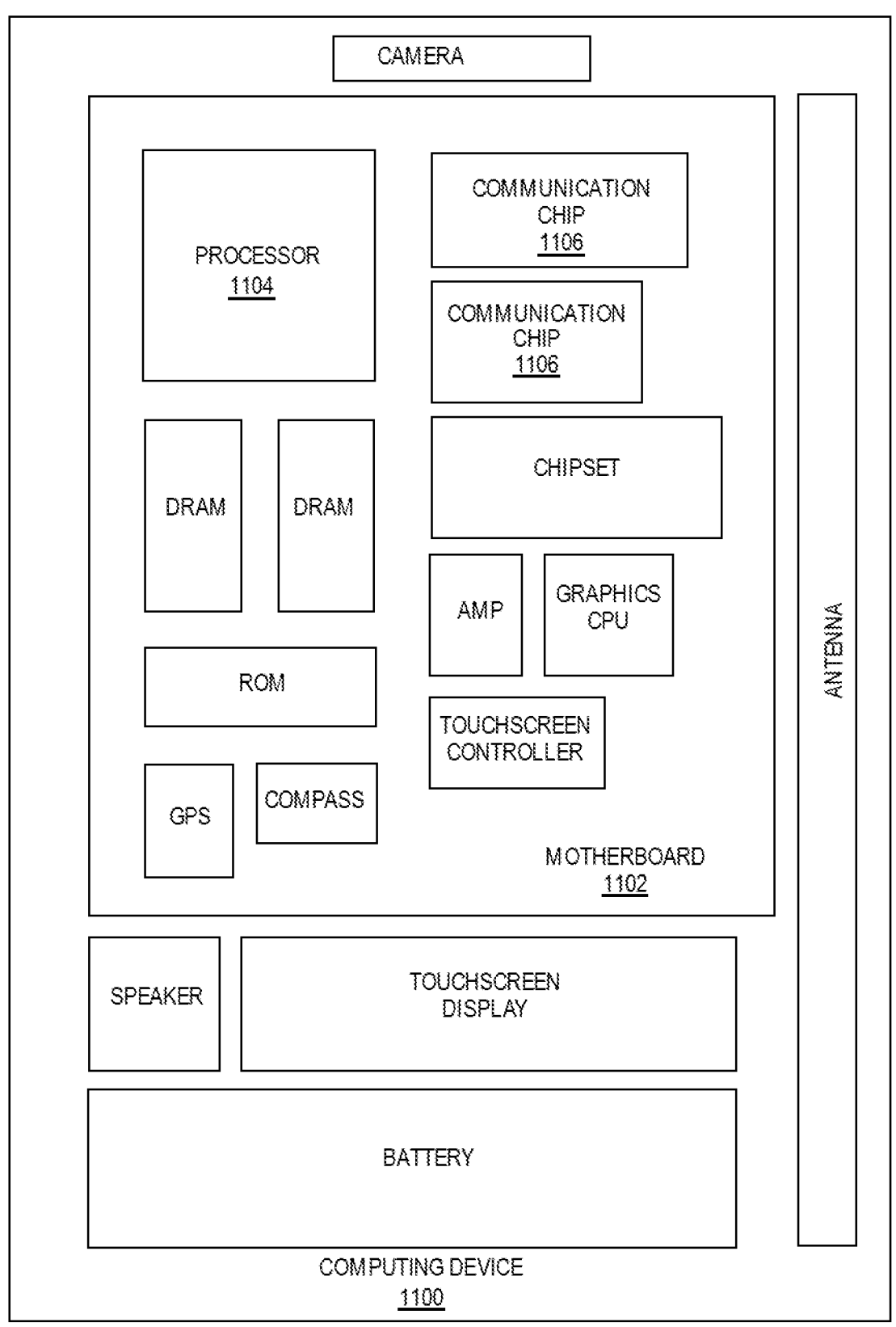
FIG. 11 illustrates a computing device in accordance with one implementation of the disclosure.

FIG. 11 illustrates a computing device 1100 in accordance with one implementation of the disclosure. The computing device 1100 houses a board 1102. The board 1102 may include a number of components, including but not limited to a processor 1104 and at least one communication chip 1106. The processor 1104 is physically and electrically coupled to the board 1102. In some implementations the at least one communication chip 1106 is also physically and electrically coupled to the board 1102. In further implementations, the communication chip 1106 is part of the processor 1104.

Depending on its applications, computing device 1100 may include other components that may or may not be physically and electrically coupled to the board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1106 enables wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

The processor 1104 of the computing device 1100 includes an integrated circuit die packaged within the processor 1104. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1106 also includes an integrated circuit die packaged within the communication chip 1106. In accordance with another implementation of the disclosure, the integrated circuit die of the communication chip is built in accordance with implementations of the disclosure.

In further implementations, another component housed within the computing device 1100 may contain an integrated circuit die built in accordance with implementations of embodiments of the disclosure.

In various embodiments, the computing device 1100 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1100 may be any other electronic device that processes data.

Figure 12:
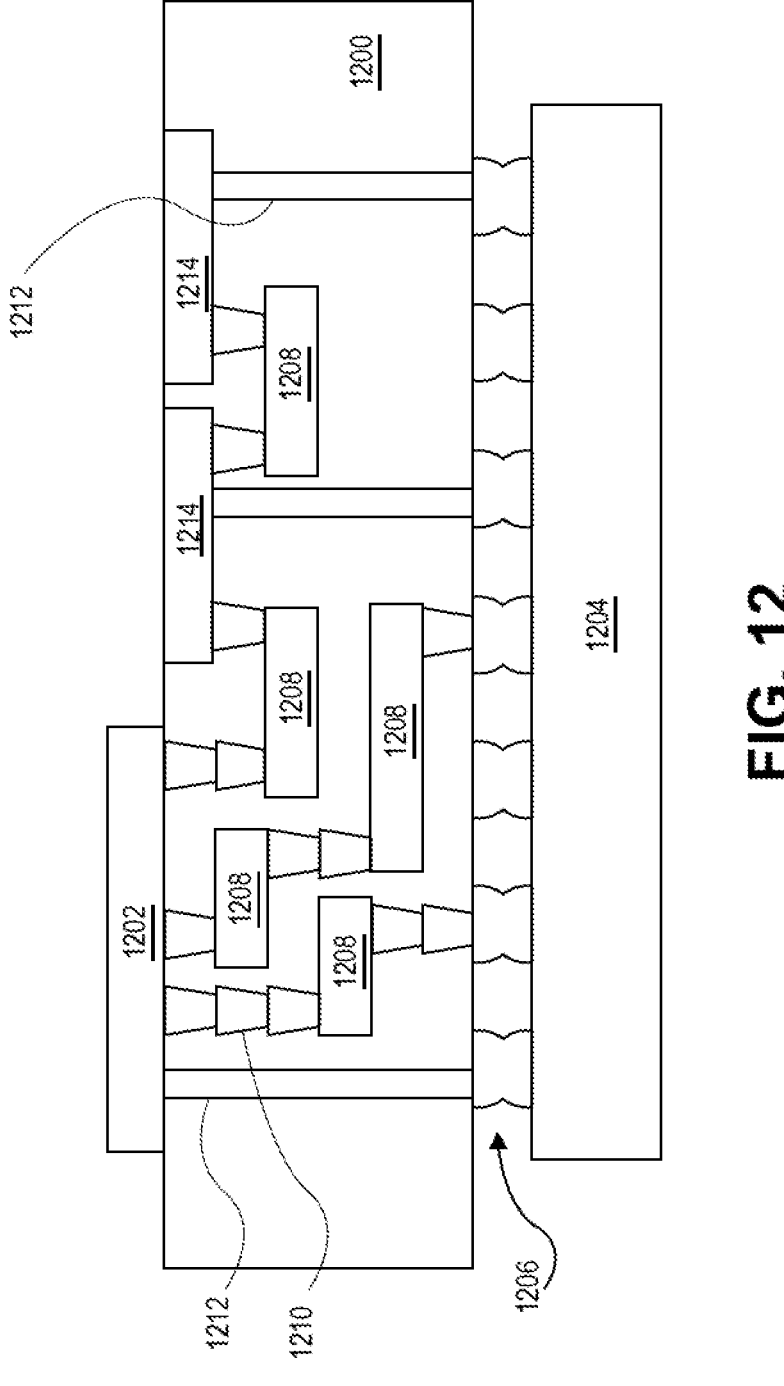
FIG. 12 illustrates an interposer that includes one or more embodiments of the disclosure.

FIG. 12 illustrates an interposer 1200 that includes one or more embodiments of the disclosure. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer 1200 may be formed of alternate rigid or flexible materials that may include the same materials described above for use in a semiconductor substrate, such as silicon, germanium, and other group III-V and group IV materials.

The interposer 1200 may include metal interconnects 1208 and vias 1210, including but not limited to throughsilicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200. In accordance with embodiments of the disclosure, apparatuses or processes disclosed herein may be used in the fabrication of interposer 1200 or in the fabrication of components included in the interposer 1200.

Figure 13:
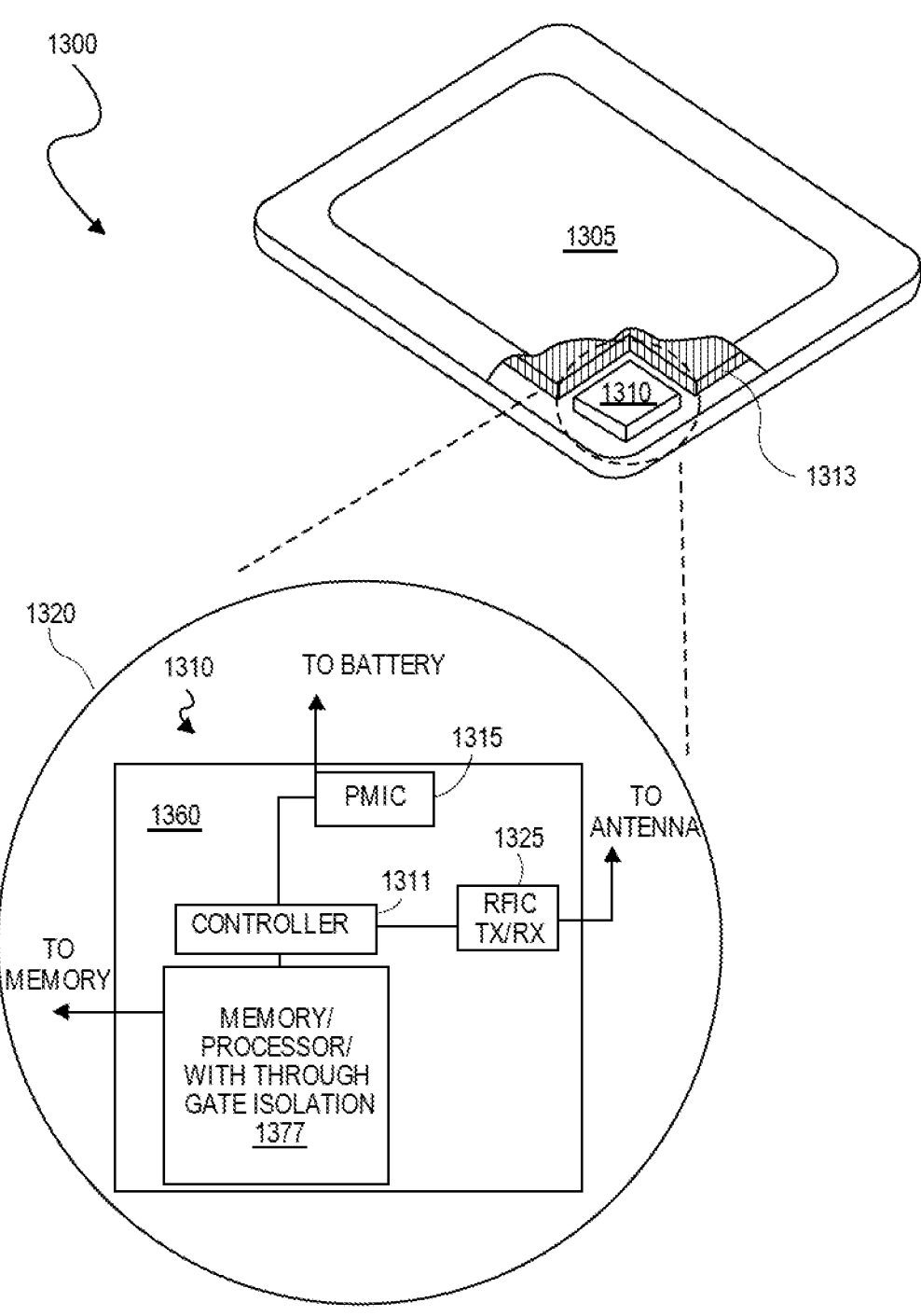
FIG. 13 is an isometric view of a mobile computing platform employing an IC fabricated according to one or more processes described herein or including one or more features described herein, in accordance with an embodiment of the present disclosure.

FIG. 13 is an isometric view of a mobile computing platform 1300 employing an integrated circuit (IC) fabricated according to one or more processes described herein or including one or more features described herein, in accordance with an embodiment of the present disclosure.

The mobile computing platform 1300 may be any portable device configured for each of electronic data display, electronic data processing, and wireless electronic data transmission. For example, mobile computing platform 1300 may be any of a tablet, a smart phone, laptop computer, etc. and includes a display screen 1305 which in the exemplary embodiment is a touchscreen (capacitive, inductive, resistive, etc.), a chip-level (SoC) or package-level integrated system 1310, and a battery 1313. As illustrated, the greater the level of integration in the system 1310 enabled by higher transistor packing density, the greater the portion of the mobile computing platform 1300 that may be occupied by the battery 1313 or non-volatile storage, such as a solid state drive, or the greater the transistor gate count for improved platform functionality. Similarly, the greater the carrier mobility of each transistor in the system 1310, the greater the functionality. As such, techniques described herein may enable performance and form factor improvements in the mobile computing platform 1300.

The integrated system 1310 is further illustrated in the expanded view 1320. In the exemplary embodiment, packaged device 1377 includes at least one memory chip (e.g., RAM), or at least one processor chip (e.g., a multi-core microprocessor and/or graphics processor) fabricated according to one or more processes described herein or including one or more features described herein. The packaged device 1377 is further coupled to the board 1360 along with one or more of a power management integrated circuit (PMIC) 1315, RF (wireless) integrated circuit (RFIC) 1325 including a wideband RF (wireless) transmitter and/or receiver (e.g., including a digital baseband and an analog front end module further includes a power amplifier on a transmit path and a low noise amplifier on a receive path), and a controller thereof 1311. Functionally, the PMIC 1315 performs battery power regulation, DC-to-DC conversion, etc., and so has an input coupled to the battery 1313 and with an output providing a current supply to all the other functional modules. As further illustrated, in the exemplary embodiment, the RFIC 1325 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1377 or within a single IC (SoC) coupled to the package substrate of the packaged device 1377.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 14:
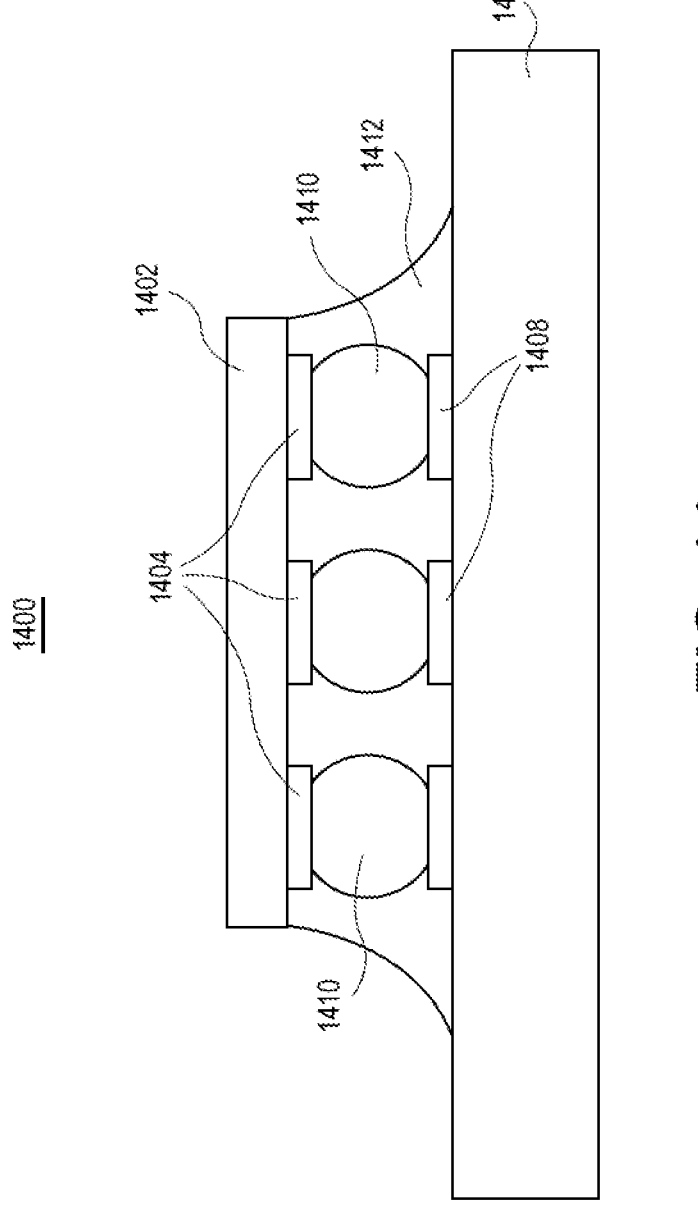
FIG. 14 illustrates a cross-sectional view of a flip-chip mounted die, in accordance with an embodiment of the present disclosure.

FIG. 14 illustrates a cross-sectional view of a flip-chip mounted die, in accordance with an embodiment of the present disclosure.

Referring to FIG. 14, an apparatus 1400 includes a die 1402 such as an integrated circuit (IC) fabricated according to one or more processes described herein or including one or more features described herein, in accordance with an embodiment of the present disclosure. The die 1402 includes metallized pads 1404 thereon. A package substrate 1406, such as a ceramic or organic substrate, includes connections 1408 thereon. The die 1402 and package substrate 1406 are electrically connected by solder balls 1410 coupled to the metallized pads 1404 and the connections 1408. An underfill material 1412 surrounds the solder balls 1410.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include metal line profile shaping and the resulting structures.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a dielectric material structure having a trench therein. A conductive interconnect line in the trench, the conductive interconnect line having a length and a width, the width having a cross-sectional profile, wherein the cross-sectional profile of the width of the conductive interconnect line has a bottom lateral width, a mid-height lateral width, and a top lateral width, and wherein the mid-height lateral width is greater than the bottom lateral width, and the mid-height lateral width is greater than the top lateral width.

Example embodiment 2: The integrated circuit structure of example embodiment 1, further including a conductive via on and in electrical contact with a portion of the conductive interconnect line.

Example embodiment 3: The integrated circuit structure of example embodiment 2, wherein a center of the conductive via is vertically offset from a center of the conductive interconnect line.

Example embodiment 4: The integrated circuit structure of example embodiment 1, 2 or 3, wherein the cross-sectional profile of the width of the conductive interconnect line is substantially spherical.

Example embodiment 5: The integrated circuit structure of example embodiment 1, 2, 3 or 4, wherein the mid-height lateral width is at least 50% greater than the bottom lateral width and at least 50% greater than the top lateral width.

Example embodiment 6: The integrated circuit structure of example embodiment 1, 2, 3, 4 or 5, wherein the cross-sectional profile of the width of the conductive interconnect line has one or more scalloped surfaces.

Example embodiment 7: The integrated circuit structure of example embodiment 1, 2, 3, 4, 5 or 6, wherein the dielectric material structure includes a stack of dielectric layers of differing composition.

Example embodiment 8: A method of fabricating an integrated circuit structure includes forming a stack of dielectric layers, wherein ones of the dielectric layers have a differing etch rate compared to others of the dielectric layers. A trench is formed in the stack of dielectric layers. The trench is exposed to a wet etch process to laterally recess the stack of dielectric layers to form a modified trench, wherein ones of the dielectric layers are recessed to a greater extent than others of the stack of dielectric layers. The modified trench is filled with a conductive material.

Example embodiment 9: The method of example embodiment 8, wherein filling the modified trench with the conductive material includes forming a conductive interconnect line in the modified trench, the conductive interconnect line having a length and a width, the width having a cross-sectional profile, wherein the cross-sectional profile of the width of the conductive interconnect line has a bottom lateral width, a mid-height lateral width, and a top lateral width, and wherein the mid-height lateral width is greater than the bottom lateral width, and the mid-height lateral width is greater than the top lateral width.

Example embodiment 10: The method of example embodiment 9, further including forming a conductive via on and in electrical contact with a portion of the conductive interconnect line.

Example embodiment 11: The method of example embodiment 10, wherein a center of the conductive via is vertically offset from a center of the conductive interconnect line.

Example embodiment 12: The method of example embodiment 9, 10 or 11, wherein the cross-sectional profile of the width of the conductive interconnect line is substantially spherical.

Example embodiment 13: The method of example embodiment 9, 10, 11 or 12, wherein the mid-height lateral width is at least 50% greater than the bottom lateral width and at least 50% greater than the top lateral width.

Example embodiment 14: The method of example embodiment 9, 10, 11, 12 or 13, wherein the cross-sectional profile of the width of the conductive interconnect line has one or more scalloped surfaces.

Example embodiment 15: The method of example embodiment 9, 10, 11, 12, 13 or 14, wherein the stack of dielectric layers includes a stack of dielectric layers of differing composition.

Example embodiment 16: A computing device includes a board, and a component coupled to the board. The component includes an integrated circuit structure. The integrated circuit structure includes a dielectric material structure having a trench therein. A conductive interconnect line in the trench, the conductive interconnect line having a length and a width, the width having a cross-sectional profile, wherein the cross-sectional profile of the width of the conductive interconnect line has a bottom lateral width, a mid-height lateral width, and a top lateral width, and wherein the mid-height lateral width is greater than the bottom lateral width, and the mid-height lateral width is greater than the top lateral width.

Example embodiment 17: The computing device of example embodiment 16, further including a memory coupled to the board.

Example embodiment 18: The computing device of example embodiment 16 or 17, further including a communication chip coupled to the board.

Example embodiment 19: The computing device of example embodiment 16, 17 or 18, wherein the component is a packaged integrated circuit die.

Example embodiment 20: The computing device of example embodiment 16, 17, 18 or 19, wherein the component is selected from the group consisting of a processor, a communications chip, and a digital signal processor.

What is claimed is:

1. An integrated circuit structure, comprising:

a dielectric material structure having a trench therein;

a conductive interconnect line in the trench, the conductive interconnect line having a length and a cross-sectional profile orthogonal to the length, wherein the cross-sectional profile is a circular cross-sectional profile, wherein the circular cross-sectional profile has a bottom lateral width, a mid-height lateral width, and a top lateral width, and wherein the mid-height lateral width is greater than the bottom lateral width, and the mid-height lateral width is greater than the top lateral width; and a conductive via coupled to conductive interconnect line, the conductive via having a center laterally offset from a center of the conductive line along a vertical axis, and the conductive via on a top and along a first side of the conductive interconnect line but not along a second side of the conductive line, the second side laterally opposite the first side.

2. The integrated circuit structure of claim 1, wherein the mid-height lateral width is at least 50% greater than the bottom lateral width and at least 50% greater than the top lateral width.

3. The integrated circuit structure of claim 1, wherein the circular cross-sectional profile has one or more scalloped surfaces.

4. The integrated circuit structure of claim 1, wherein the dielectric material structure comprises a stack of dielectric layers of differing composition.

\* \* \* \* \*